United States Patent
Korobkov

(10) Patent No.: US 6,895,524 B2
(45) Date of Patent: May 17, 2005

(54) CIRCUIT REDUCTION TECHNIQUE FOR IMPROVING CLOCK NET ANALYSIS PERFORMANCE

(75) Inventor: Alexander Korobkov, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 547 days.

(21) Appl. No.: 09/967,579

(22) Filed: Sep. 28, 2001

(65) Prior Publication Data

US 2003/0065965 A1 Apr. 3, 2003

(51) Int. Cl.[7] .............................................. G06F 1/04
(52) U.S. Cl. ....................... 713/500; 716/2; 716/4; 716/5; 716/6; 716/7; 716/8; 716/18; 703/14
(58) Field of Search ................................. 713/500, 560; 716/2, 4, 5, 6, 7, 8, 18; 703/14

(56) References Cited

U.S. PATENT DOCUMENTS

| | | | | |
|---|---|---|---|---|
| 5,644,498 A | * | 7/1997 | Joly et al. ...................... 716/2 |
| 5,903,578 A | * | 5/1999 | De et al. ...................... 714/726 |
| 6,249,901 B1 | * | 6/2001 | Yuan et al. ...................... 716/5 |
| 6,311,317 B1 | * | 10/2001 | Khoche et al. ............... 716/18 |
| 6,345,378 B1 | * | 2/2002 | Joly et al. ...................... 716/2 |
| 6,374,205 B1 | * | 4/2002 | Kuribayashi et al. ......... 703/14 |
| 6,381,730 B1 | * | 4/2002 | Chang et al. .................. 716/5 |
| 6,438,729 B1 | * | 8/2002 | Ho ................................ 716/1 |
| 6,536,018 B1 | * | 3/2003 | Chisholm et al. .............. 716/4 |
| 6,598,213 B1 | * | 7/2003 | Graef ............................ 716/6 |
| 6,643,831 B2 | * | 11/2003 | Chang et al. .................. 716/4 |
| 6,704,911 B2 | * | 3/2004 | Yang ............................. 716/2 |
| 6,732,340 B1 | * | 5/2004 | Akashi ........................... 716/5 |

* cited by examiner

Primary Examiner—A. Elamin
(74) Attorney, Agent, or Firm—Osha & May L.L.P.

(57) ABSTRACT

A method for reducing a transistor circuit netlist for clock network timing verification is provided. Further, a simulation tool that reduces a transistor circuit netlist such that nonlinear circuit properties are preserved is provided. Further, a computer system that improves clock network performance by simulating a netlist that is generated from a reduced transistor circuit netlist is provided.

12 Claims, 3 Drawing Sheets

CIRCUIT REDUCTION TECHNIQUE FOR IMPROVING CLOCK NET ANALYSIS PERFORMANCE

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another to accomplish the tasks of the computer system (10).

In order to properly accomplish such tasks, the computer system (10) relies on the basis of time to coordinate its various operations. To this end, one or more clock signals are provided to various components within the computer system (10). The providing of these clock signals is achieved through the use of clock distribution networks. A clock distribution network distributes a clock signal to various components that depend in order to perform operations in a timely, accurate, and predictable manner.

FIG. 2 shows a typical clock distribution network (20) for an integrated circuit. The clock distribution network (20) provides, via one or more clock buffers/drivers (22) clock signals to a global clock grid (24) and one or more local clock grids (26), latches (28), and/or flip-flops (30). Because the performance of a computer system so heavily relies on the accurate and timely distribution of clock signals to the various components of the integrated circuit, timing verification of clock distribution networks (also referred to as "clock network verification") is an important step in the design cycle of an integrated circuit.

Such timing verification typically involves reducing the integrated circuit to a manageable size and then simulating operations on the reduced circuit. The integrated circuit is often reduced at a transistor level to achieve better performance and shorter design cycle time for the clock distribution network timing verification process.

As computers continue to operate at ever-increasing clock speeds, circuit complexity, and sizes, the timing verification for clock distribution networks is becoming an issue of critical importance in integrated circuit design. Accordingly, the run time needed to produce precise clock system timing evaluations during a design and development stage has increased significantly, and often violates industry chip design schedules.

Referring to transistor level reduction, transistors and transistor-based circuits, which are often used to amplify clock signals that propagate through a clock distribution network, are typically built to fit design requirements and constraints such as chip area availability, power availability, timing budgets, etc. However, such circuit configurations are difficult to handle directly by accurate timing verification simulation tools due to the large complexity and size of modem integrated circuits. Reduction and subsequent simulation of such circuit configurations can cause long simulation times that result in design cycle violations.

FIG. 3 shows a flow process of a typical reduction for clock network verification. Before actual reduction, a circuit layout or design is stored in some accessible database (40). A transistor extraction tool is applied to the circuit layout stored in the database (step 42), where after the transistor extraction tool generates a transistor circuit netlist (44). Similarly, a parasitics extraction tool is applied to the circuit layout stored in the database (step 46), where after the parasitics extraction tool generates a parasitics netlist (48).

The transistor circuit netlist and parasitics netlist are then available to a netlist processor stage (step 50), which, it turn, prepares an electrical netlist for simulation (52). A timing simulation tool then simulates the electrical netlist (52) (step 54) and generates timings (56) for the circuit.

FIG. 4 shows an expanded flow process of the netlist processor step shown in FIG. 3. Upon generation of the transistor circuit netlist (44), cell wrapper files for the transistor circuit netlist are generated (step 58). Using the transistors listed in the transistor circuit netlist (44), the cell wrappers generation stage (step 58) encloses each transistor's lower level components in a cell wrapper, or "package."

Thereafter, the transistor circuit netlist and parasitics netlist go through a voltage source connection stage (step 60) and a library attachments stage (step 62). In the voltage source connection stage (step 60), the wrapped cells are connected to voltage sources specified in the original circuit. The parasitic netlist (48) is also used in the voltage source connection stage (step 60) when connecting the cells to voltage sources to account for the parasitics in the circuit components and connections. In the library attachments stage (step 62), property libraries of the various components within the circuit netlist are attached for use by the timing simulation tool. The wrapper generation stage (step 58), the voltage source connection stage (step 60), and the library attachments stage (step 62) are used to build the overall circuit netlist for more efficient timing simulation. However, as discussed above, with the increasing speeds, complexity, and size of modern integrated circuits, timing simulations as discussed with references to FIGS. 3 and 4 are proving to prone to inaccuracy and are highly time intensive.

One way to reduce the amount of time needed to produce timing evaluations is to use a software tool designed to use less simulation time. However, the accuracy of the timing results that can be produced by such a software tool is usually not great enough to meet timing requirements imposed by clock signal propagation time and skew verification.

SUMMARY OF INVENTION

According to one aspect of the present invention, a method for performing clock analysis on an original circuit using a transistor circuit netlist and a parasitics netlist comprises generating a reduced circuit netlist partly based on the transistor circuit netlist, connecting a cell within the reduced circuit netlist and parasitics netlist to at least one voltage source specified in an original circuit, and attaching information to the cell in order to create a netlist for simulation, where the netlist for simulation is used for the clock analysis on the original circuit.

According to another aspect, a computer system having a timing simulation tool comprises a memory and an integrated circuit, wherein the timing simulation tool resides in the memory and executes instructions on the integrated circuit in order to generate a reduced transistor circuit netlist, where generating the reduced transistor circuit netlist uses data comprising at least one selected from the group consisting of a clock cell, a clock pin, and a rule.

According to another aspect, a software tool comprises a first portion that reduces a transistor circuit netlist to a reduced transistor circuit netlist, a second portion that connects a cell within the reduced circuit netlist and a parasitics netlist to at least one voltage source specified in an original circuit, and a third portion that attaches information to the cell in order to create a netlist for simulation, where the netlist for simulation is used for clock analysis on the original circuit.

Other aspects and advantages of the invention will be apparent from the following description and the appended claims.

DETAILED DESCRIPTION

Embodiments of the present invention relate to a method for automatically generating a reduced transistor circuit based on an original circuit. Embodiments of the present invention further relate to a tool that automatically generates a reduced transistor circuit based on an original circuit. Embodiments of the present invention further relate to a method for improving circuit reduction by considering a superlinear dependence between simulation run time and a number of nonlinear devices that are simulated during a clock network verification stage. Embodiments of the present invention relate to a method for reducing a number of nonlinear devices (such as transistor circuits) simulated in order to reduce time spent in simulation.

Figure 1:
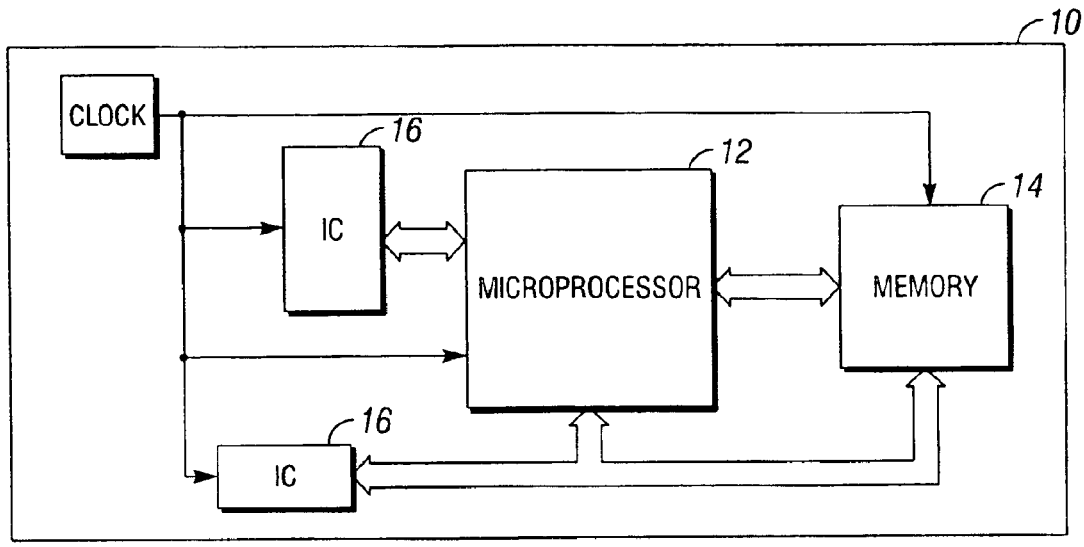
FIG. 1 shows a typical computer system.
Figure 2:
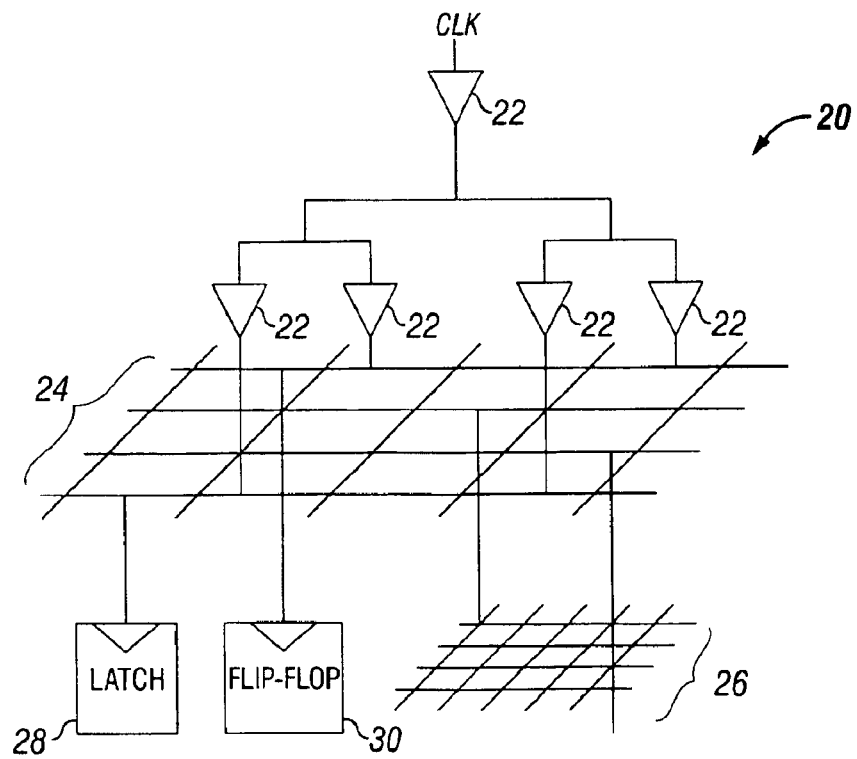
FIG. 2 shows a typical clock distribution network.
Figures 3, 4:
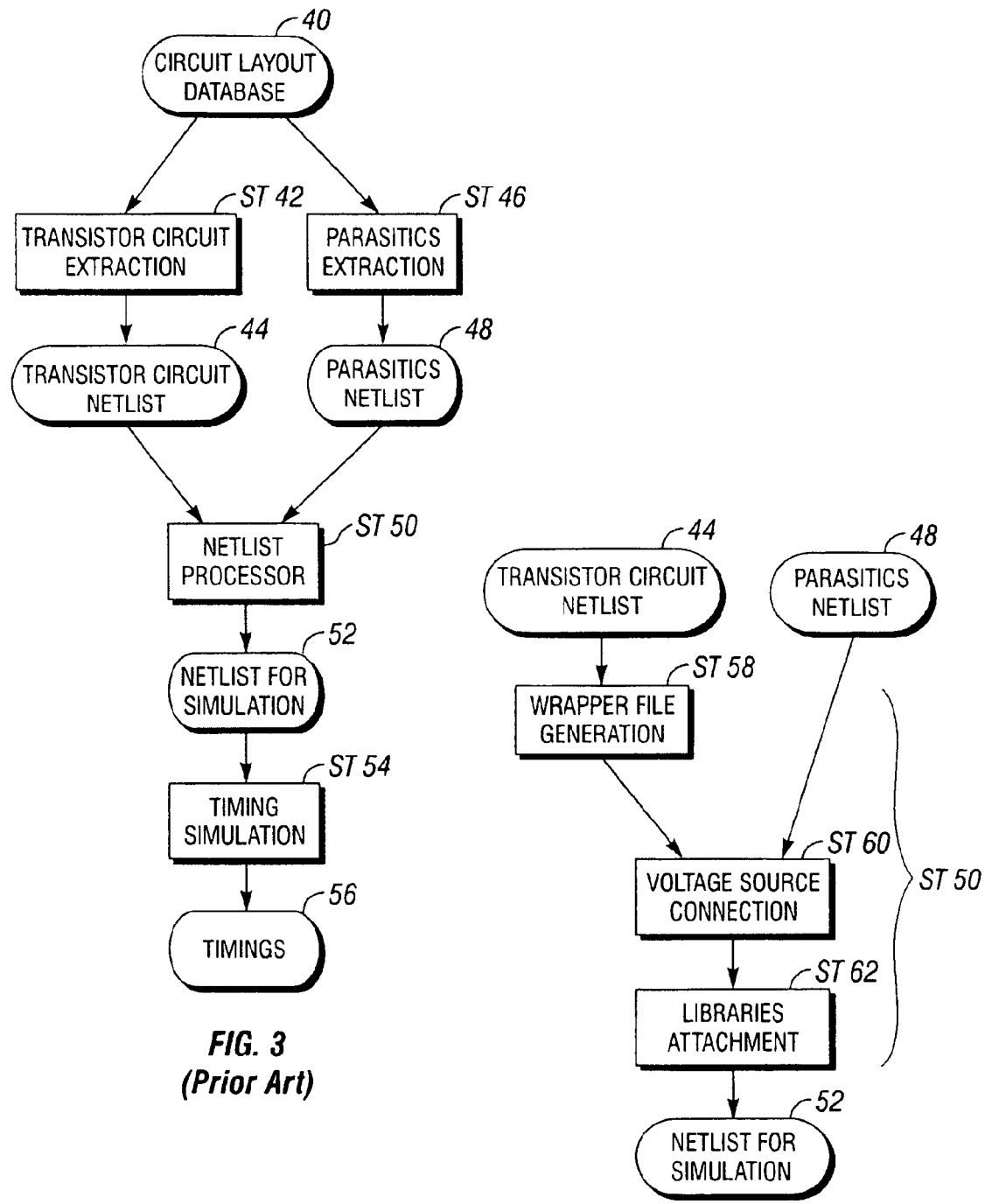
FIG. 3 shows a flow process of a typical reduction for clock network verification.
FIG. 4 shows a flow process in accordance with the flow process shown in FIG. 3.
Figure 5:
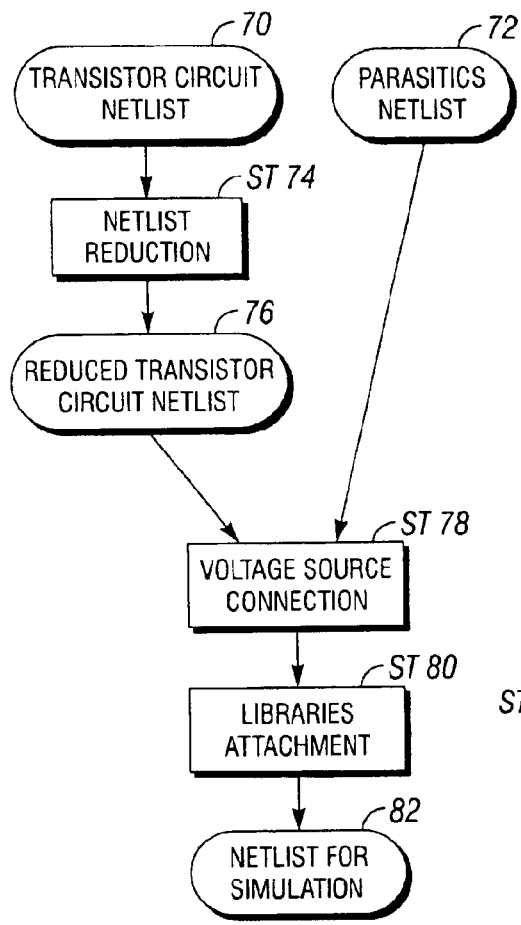
FIG. 5 shows a flow process in accordance with an embodiment of the present invention.

FIG. 5 shows an exemplary flow process in accordance with an embodiment of the present invention. A netlist processor stage (steps 74–80) uses a transistor circuit netlist (70) and a parasitics netlist (72) to create a netlist for simulation (82). Within the netlist processor stage (steps 74–80), the transistor circuit netlist (step 70) goes through a netlist reduction stage (step 74), which, in turn, generates a reduced transistor circuit netlist (76). The reduced transistor circuit netlist (76) and the parasitics netlist (72) are then used by a voltage source connection stage (step 78). Thereafter, the netlist being produced by the netlist processor stage (steps 74–80) goes through a libraries attachment stage (step 80), where after the netlist for simulation (82) is generated.

Figure 6:
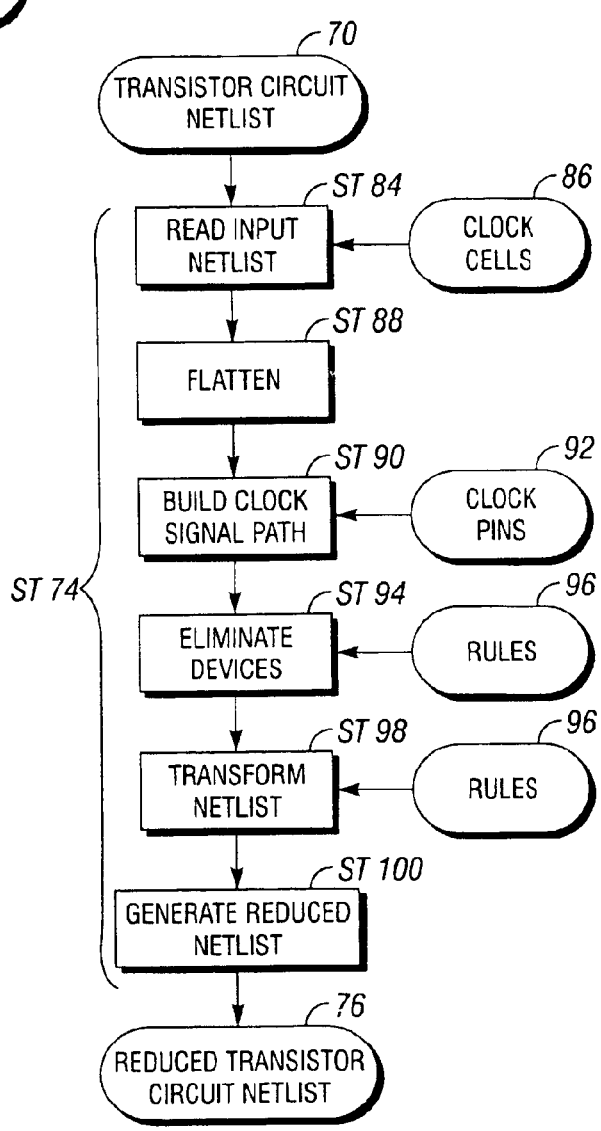
FIG. 6 shows a flow process in accordance with the embodiment shown in FIG. 5.

FIG. 6 shows an exemplary flow process of the netlist reduction stage (step 74) in accordance with the embodiment shown in FIG. 5. Data used in the netlist reduction stage (step 74) includes a list of clock buffer, flip-flop, and latch cells (shown collectively in FIG. 6 as "clock cells") belonging to a particular clock signal propagation path. The data used by the netlist reduction stage (step 74) further includes a predefined list of names of external pins (shown in FIG. 6 as "clock pins") that are used by the clock signal propagation path. Additionally, the data used by the netlist reduction stage (step 74) includes one or more sets of rules (shown in FIG. 6 as "rules") for device elimination and circuit netlist transformation. Those skilled in the art will appreciate that although these rules may be specific for each type of clock design, they use a similar format for the convenience of data accessibility.

Within the netlist reduction stage (step 74), the transistor circuit netlist (also referred to as "original circuit netlist") (70) is read (step 84). The reading input netlist stage (step 84) parses the original circuit netlist according to the clock cells (86) in the clock signal propagation path. Those skilled in the art will appreciate that the reading input netlist stage (step 84) also involves building a graph-oriented memory structure for each of the clock cells (86) under consideration, where the graph-oriented memory structure represents the original cell structure in the input specification.

Next, a circuit flattening stage (step 88) involves removing cell hierarchy from the clock cells (86) if a hierarchy exists. This may be done using a graph-oriented memory structure produced in the reading input netlist phase (step 84).

A building clock signal path stage (step 90) traverses graph-oriented memory structures to build a clock signal propagation path. Clock pins (92) are used as reference points for the path. When completed, the clock signal propagation path contains a list of the nodes internal to each of the clock cells (86) belonging to the actual, physical clock signal propagation path.

A device elimination stage (step 94) eliminates devices from the clock signal propagation path that have no impact on the path's timing properties. Rules (96) used in device elimination may require that the device elimination stage (step 94) preserve the electrical properties, and, therefore, preserve the timing accuracy of the circuit layout. In effect, devices which have no effect on the timing properties of the circuit may be eliminated.

A netlist transformation stage (step 98) repairs connections that were broken in the device elimination stage (step 94). Networks which were broken apart are connected to other networks such as the clock, voltage supply, and ground networks. As in the device elimination stage (step 94), rules (96) used in netlist transformation ensure the preservation of all electrical properties of the original circuit. Using the requirements laid out in the rules (96), the netlist transformation stage (step 98) identifies device clusters, which may contain any number of devices, and joins devices within these clusters.

A reduced netlist generation stage (step 100) uses the one or more netlists produced by the netlist transformation stage (98) and creates the reduced transistor circuit netlist (76). The reduced transistor circuit netlist (76) includes devices remaining after device elimination and netlist transformation as well as including clock pins (92) connected to the clock signal propagation path, voltage supply nets, and ground nets.

Advantages of the present invention may include one or more of the following. In some embodiments, because a reduced transistor circuit netlist is created, performance of a netlist processor is increased while maintaining an acceptable level of timing accuracy.

In some embodiments, because a reduced transistor circuit netlist may be automatically generated from an original circuit extracted from a chip design, simulation time is decreased relative to when the reduced transistor circuit netlist is not used.

In some embodiments, because the electrical properties of an original circuit are maintained during generation of a reduced transistor circuit netlist, accuracy of the original circuit may be preserved in the reduced transistor netlist.

In some embodiments, because an amount of nonlinear devices gets smaller as a result of netlist reduction, numerical integration based software tools (like SPICE) used for a clock verification purpose obtain additional stability, effectively increasing the software tool's ability to produce data for a wide range of circuit configurations, inclusive of those which failed for an original circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for performing clock analysis on an original circuit using a transistor circuit netlist and a parasitics netlist, comprising:
   generating a reduced circuit netlist partly based on the transistor circuit netlist, wherein the generating is dependent on information about clock cells in a clock signal propagation path of the original circuit;
   connecting a cell within the reduced circuit netlist and parasitics netlist to at least one voltage source specified in the original circuit; and
   attaching information to the cell in order to create a netlist for simulation,
   wherein the netlist for simulation is used for the clock analysis on the original circuit.

2. The method of claim 1, wherein the circuit netlist is a transistor circuit netlist.

3. The method of claim 1, wherein the cell is a clock cell.

4. The method of claim 1, further comprising:
   reading the circuit netlist, wherein reading the circuit netlist comprises:
      parsing the circuit netlist according to at least one clock cell in the clock signal propagation path; and
      building a graph-oriented memory structure for the at least one clock cell, wherein the graph-oriented memory structure represents a cell structure in an input specification;
   selectively removing hierarchy from the graph-oriented memory structure;
   traversing the graph-oriented memory structure to build the clock signal propagation path, wherein clock pins are used as reference points for the clock signal propagation path;
   selectively eliminating devices from the clock signal propagation path that have no impact on the a timing property of the clock signal propagation path; and
   generating the reduced circuit netlist.

5. The method of claim 4, further comprising:
   repairing a connection broken while selectively eliminating device.

6. The method of claim 5, wherein selectively eliminating devices and repairing the connection is dependent on a predefined rule.

7. A computer system having a timing simulation tool, comprising:
   a memory; and
   an integrated circuit;
   wherein the timing simulation tool resides in the memory and executes instructions on the integrated circuit in order to generate a reduced transistor circuit netlist, wherein generating the reduced transistor circuit netlist is dependent on the information about clock cells in a clock signal propagation path of an original circuit.

8. The computer system of claim 7, wherein a transistor circuit netlist is reduced to the reduced transistor circuit netlist, wherein the transistor circuit netlist and a parasitics netlist are extracted from a design layout of the original circuit, and wherein the reduced transistor circuit netlist and the parasitics netlist are used to create a netlist for simulation.

9. The computer system of claim 8, wherein the netlist for simulation is used by the timing simulation tool to analyze clock network performance of the original circuit.

10. A software tool, comprising:
    a first portion that reduces a transistor circuit netlist to a reduced transistor circuit netlist, dependent on information about clock cells in a clock signal propagation path of an original circuit;
    a second portion that connects a cell within the reduced circuit netlist and a parasitics netlist to at least one voltage source specified in the original circuit; and
    a third portion that attaches information to the cell in order to create a netlist for simulation;
    wherein the netlist for simulation is used for clock analysis on the original circuit.

11. The software tool of claim 10, wherein the first portion comprises:
    a portion that reads the circuit netlist, wherein the portion comprises:
       a portion that parses the circuit netlist according to at least one clock cell in the clock signal propagation path; and
       another portion that builds a graph-oriented memory structure for the at least one clock cell, wherein the graph-oriented memory structure represents a cell structure in an input specification;
    another portion that selectively removes hierarchy from the graph-oriented memory structure;
    another portion that traverses the graph-oriented memory structure to build the clock signal propagation path, wherein clock pins are used as reference points for the clock signal propagation path;
    another portion that selectively eliminates devices from the clock signal propagation path that have no impact on the a timing property of the clock signal propagation path; and
    another portion that generates the reduced circuit netlist.

12. The simulation tool of claim 10, wherein the simulation tool reduces the transistor circuit netlist such that nonlinear circuit properties are preserved, wherein the nonlinear circuit properties comprise electrical properties of the original circuit.

* * * * *

UNITED STATES PATENT AND TRADEMARK OFFICE
CERTIFICATE OF CORRECTION

PATENT NO. : 6,895,524 B2  Page 1 of 1
DATED : May 17, 2005
INVENTOR(S) : Alexander Korobkov It is certified that error appears in the above-identified patent and that said Letters Patent is hereby corrected as shown below:

Column 6,
Line 3, please remove the word "the" after the word "on".

Signed and Sealed this

Nineteenth Day of July, 2005

JON W. DUDAS
*Director of the United States Patent and Trademark Office*